United States Patent [19]

Eisenbraun et al.

[11] Patent Number: 4,950,734

[45] Date of Patent: Aug. 21, 1990

[54] COMPOSITIONS FOR PRODUCTION OF ELECTRONIC COATINGS

[75] Inventors: Allan A. Eisenbraun; Wesley C. Blocker, both of Baton Rouge, La.

[73] Assignee: Ethyl Corporation, Richmond, Va.

[21] Appl. No.: 255,610

[22] Filed: Oct. 11, 1988

[51] Int. Cl.[5] ............... C08G 69/26; C08G 12/00; B05D 3/02; B05D 3/12
[52] U.S. Cl. .................. 528/353; 528/176; 528/188; 528/229; 427/240; 427/346; 427/384; 427/385.5
[58] Field of Search ............... 528/353, 176, 188, 229; 427/240, 384, 385.5, 346

[56] References Cited

U.S. PATENT DOCUMENTS 4,203,922  5/1980  Jones et al. ..................... 528/125

FOREIGN PATENT DOCUMENTS 1062435  3/1967  United Kingdom ............... 528/353

Primary Examiner—Morton Foelak
Assistant Examiner—P. Hampton Hightower
Attorney, Agent, or Firm—John F. Sieberth; Richard J. Hammond

[57] ABSTRACT

In humid atmospheres (e.g., 55% relative humidity or above) solutions of 2,2-bis(3,4-dicarboxyphenyl)hexafluoropropane dianhydride/2,2-bis[4-(aminophenoxy)-phenyl]hexafluoropropane polyamic acid polymers tend to be unstable in the sense that during spin coating operations undesirable precipitate formation may occur on the rotating surface of a semiconductor wafer. The result is the formation of unacceptable coatings due to their irregularity and lack of uniformity. Described are solutions of these polyamic acid polymers in a solvent containing at least 40% by weight of one or more liquid aromatic hydrocarbons having a boiling point of at least about 110° C. and at least 5% by weight of one or more dipolar aprotic solvents having a boiling point of at least about 150° C., such that the solution (a) contains on a weight basis from about 5% to about 40% of the polyamic acid and (b) does not undergo precipitate formation during spin coating in an atmosphere of up to at least about 55% relative humidity.

14 Claims, No Drawings

COMPOSITIONS FOR PRODUCTION OF ELECTRONIC COATINGS

BACKGROUND

Polyimides derived from 2,2-bis(3,4-dicarboxyphenyl)hexafluoropropane dianhydride and 2,2-bis[4-(aminophenoxy)phenyl]hexafluoropropane are useful, inter alia, for the production of electronic coatings on semiconductor wafers, such as polysilicon wafers. One way of forming such coatings on the wafers is to apply a solution of a polyamic acid polymer derived from 2,2-bis(3,4-dicarboxyphenyl)hexafluoropropane dianhydride and 2,2-bis[4-(aminophenoxy)phenyl]hexafluoropropane to the wafer and thereafter bake the coated wafer to cure (imidize) the resin so that the corresponding polyimide is formed. In order to apply solutions of such polyamic acids to the wafers spin coating procedures are used, and in these operations purity, integrity, and uniformity of the resultant coating are essential.

Unfortunately it has been discovered that in humid atmospheres (e.g., about 55% relative humidity or above) solutions of such polyamic acid polymers in some commonly used solvents (e.g., N-methylpyrrolidone) tend to be unstable in the sense that during spin coating operations undesirable precipitate formation occurs on the rotating surface of the wafer. The result is that the coating loses adhesion to the wafer and flies off of it during spin coating.

The need thus exists for solutions of 2,2-bis(3,4-dicarboxyphenyl)hexafluoropropane dianhydride/2,2-bis[4-(aminophenoxy)phenyl]hexafluoropropane polyamic acid polymers which do not undergo undesirable precipitate formation on rotating wafer surfaces when used in spin coating operations even if conducted under conditions of 55% relative humidity. This invention is deemed to fulfill this need in an effective and efficient manner.

THE INVENTION

In accordance with this invention there is provided a partially fluorinated polyamic acid polymer composition especially adapted for use in spin coating wafers of semiconductive materials. Such composition comprises a solution of (i) a 2,2-bis(3,4-dicarboxyphenyl)hexafluoropropane dianhydride/2,2-bis[4(aminophenoxy)phenyl]hexafluoropropane polyamic acid polymer having an inherent viscosity in the range of about 0.2 to about 1.5 dL/g — as measured in N-methylpyrrolidone at room temperature (25° C.) at a concentration of 0.5 g/dL — in (ii) a solvent containing at least 40% by weight of one or more liquid aromatic hydrocarbons having a boiling point of at least about 110° C. and at least 5% by weight of one or more dipolar aprotic solvents having a boiling point of at least about 150° C., such that the solution (a) contains on a weight basis from about 5% to about 40% of such polyamic acid and (b) does not undergo precipitate formation during spin coating in an atmosphere of up to at least about 55% relative humidity. These solutions preferably contain on a weight basis from about 10% to about 25% of such polyamic acid. It is also preferable that the inherent viscosity of the polyamic acid (as measured at a concentration of 0.5 g/dL in N-methylpyrrolidone at room temperature) fall in the range of about 0.3 to about 0.9 dL/g.

Preferably, the polyamic acid is produced in the dipolar aprotic solvent (with or without a co-solvent) although if desired, it may be formed in a different reaction medium, recovered therefrom, and then dissolved in the dipolar aprotic solvent or a mixture of the dipolar aprotic solvent and the aromatic hydrocarbon (in either case with or without one or more additional co-solvents). As is well known, polyamic acids are formed by reacting essentially equimolar proportions of a primary diamine with a tetracarboxylic acid dianhydride. Thus in the practice of this invention it is preferred to produce the solutions by reacting in an appropriate reaction solution, an essentially equimolar mixture of 2,2-bis(3,4-dicarboxyphenyl)hexafluoropropane dianhydride and a 2,2-bis[4-(aminophenoxy)phenyl]hexafluoropropane, e.g. 2,2-bis[4-(3-aminophenoxy)phenyl]hexafluoropropane, a mixture of 2,2-bis[4-(3-aminophenoxy)phenyl]hexafluoropropane and 2,2-bis[4-(4-aminophenoxy)phenyl]hexafluoropropane, or most preferably, 2,2-bis[4-(4-aminophenoxy)phenyl]hexafluoropropane.

Polyamic acids are converted to polyimides at about 140° C. or above. Thus during the synthesis reaction, the reaction mixture should be kept at a suitably low temperature (usually below about 100° C.) in order to avoid premature formation of excessive quantities of the polyimide. Likewise the solutions of this invention should not be exposed to excessive temperatures until it is desired to convert the polyamic acid-coated article into a polyimide-coated article.

As noted above, the solvent used contains at least 40% by weight of aromatic hydrocarbon having a boiling point of at least about 110° C. and at least 5% by weight of dipolar aprotic solvent boiling above about 150° C. This combination may be the sole or the predominant solvent employed in the solution. Thus other solvents may be copresent provided they do not, in the concentrations employed, adversely affect the stability and desirable spin coating characteristics of the resultant solution when used in an atmosphere of up to about 55% relative humidity. Generally speaking, other solvents which may be present in appropriate proportions include aromatic hydrocarbon solvents boiling below about 110° C., and aprotic solvents.

Examples of the aromatic hydrocarbon solvents with boiling points above about 110° C. include
    1,2,3,4-tetramethylbenzene 1,2,3,5-tetramethylbenzene toluene o-xylene m-xylene p-xylene 1,2-diethylbenzene 1,3-diethylbenzene 1,4-diethylbenzene 3,5-diethyltoluene n-butylbenzene 3-propyltoluene 4-propyltoluene tetrahydronaphthalene
and the like, including mixtures of two or more such solvents.

Examples of dipolar aprotic solvents with boiling points above about 150° C. include
    N,N-dimethylformamide N,N-dimethylacetamide N-methylpyrrolidone dimethylsulfoxide
and the like, including mixtures of two or more such solvents.

Examples of other solvents which may be used as co-solvents include
    cyclohexanone 2-methylcyclohexanone 3-methylcyclohexanone 4-methylcyclohexanone cycloheptanone cyclooctanone isophorone tetrahydrofuran diethylene glycol dimethyl ether triethylene glycol dimethyl ether dimethoxyethane acetone methylethylketone
and the like, including mixtures of two or more such solvents.

Liquid methylbenzenes having boiling points above 130° C. are the most preferred aromatic hydrocarbons for use in the practice of this invention. The most preferred dipolar aprotic solvent for such use is N-methylpyrrolidone.

Needless to say, the reactants and solvent(s) used in forming the compositions of this invention should have sufficiently high purities to satisfy the requirements of electronic coatings. Thus the solids are preferably recrystallized from highly pure solvents and the liquids are preferably purified by use of distillation or other purification techniques.

In another of its forms, this invention provides a method of forming a coating upon a planar substrate such as a semiconductor wafer. In this method a suitable quantity of a composition of this invention is applied to the central region of the planar surface and the substrate is rotated at a speed sufficient through centrifugal effect to cause the composition to flow outwardly to the perimeter of the surface and in so doing form a substantially uniform liquid coating thereon. Ordinarily rotational speeds in the range of about 1,000 to about 10,000 rpm for periods in the range of about 10 seconds to about 5 minutes are most useful, although departures from either or both of these ranges may be employed where the circumstances warrant or justify such departures. Generally speaking, the higher the rotational speed, the thinner the coating. Once the liquid coating has been formed over the planar surface the coated substrate is heated to an elevated temperature normally in the range of 80 to about 130° C. to dry the coating without destroying its integrity. Thereafter the dried coating is heated to a still higher temperature (e.g., in the range of about 200° C. to about 450° C.) to cure the coating. It has been found that if the dried coated substrate is heated to a temperature of at least about 350° C., the solvent resistance of the coating is improved.

A wide variety of substrates may be coated in this manner, including metals, ceramics, high temperature resistant polymers, intermetallic compounds and compound semiconductors (e.g., GaAs, $GaAs_xP_{1-x}$, etc.), and the like. Usually, but not necessarily, the substrate will be in the form of a disc or wafer.

The practice and advantages of this invention are illustrated in the following examples. Example 1 typifies one of the procedures that may be used to produce the compositions of this invention. A method of utilizing the compositions of this invention in spin coating operations is illustrated in Example 2.

EXAMPLE 1

2,2-Bis(3,4-dicarboxyphenyl)hexafluoropropane dianhydride/2,2bis[4-(aminophenoxy)phenyl]hexafluoropropane polyamic acid polymer was produced by adding 21.326 g of 2,2-bis(3,4-dicarboxyphenyl)hexafluoropropane dianhydride (98.6% pure) to a stirred solution of 24.887 g of 2,2-bis[4-(4-aminophenoxy)phenyl]hexafluoropropane in 100 g of N-methylpyrrolidone (NMP) heated to 80° C. Stirring was effected by means of a double spiral agitator, and the system was maintained under a dry nitrogen atmosphere. An additional 8.01 g of NMP was used to rinse the anhydrides into the diamine solution. The reaction mixture was kept at 80° C. for two hours with stirring. The resultant polyamic acid had an inherent viscosity of 0.99 dL/g as measured in NMP at room temperature at a concentration of 0.5 g/dL. A portion of this solution (11.58 g) was thoroughly mixed overnight with 6.58 g of 1,2,3,4-tetramethylbenzene (TMB) to produce a polyamic acid solution in a solvent system composed by weight of 55% NMP-45% TMB. Another portion of the reaction solution was used in forming a polyamic acid solution (18% solids) in a solvent system composed of 50% NMP, 25% TMB and 25% xylene.

EXAMPLE 2

Spin coating tests were carried out in order to determine the behavior of different polyamic acid solutions under conditions of controlled relative humidity. The procedure employed in these tests involved use in a room of controllable humidity of a spin coater equipped with a rotatable vacuum chuck for holding the wafer in place in a horizontal position, and a fume exhaust system. Commercially available silicon wafers three inches in diameter were used as the substrates for the coatings. With the wafer held in a horizontal non-rotating position, a quantity of approximately three grams of coating solution was applied to the center of the wafer, and the wafer was then spun at 5000 rpm for one minute. During this time the wafer was subjected to visual observation to determine the characteristics of the coating. Coatings which develop a milky white appearance (precipitate formation) or which spin off pieces of coating are unsatisfactory. Satisfactory coatings show neither such defect; rather, they remain clear, smooth and uniform in appearance.

The results of these tests are summarized in the following table wherein NMP represents N-methylpyrrolidone, TMB represents 1,2,3,4-tetramethylbenzene, XYL represents xylene, No PPT signifies that no precipitate formation occurred during the spin coating operation, and PPT signifies that precipitate formation occurred during the spin coating operation. The percentages shown for the solvent and solids (solids represents the concentration of the polyamic acid in the solvent) are on a weight basis, and the inherent viscosities shown (which are a measure of the molecular weights of the polyamic acid polymers) were measured in N-methylpyrrolidone at room temperature (25° C.) at a polyamic acid concentration of 0.5 g/dL, and are expressed as dL/g.

TABLE

Results of Spin Coating Operations

| Run No. | Solvent, wt. % | Solids % | Inherent Viscosity | Relative Humidity, % | Behavior During Spin |
|---|---|---|---|---|---|
| Comparative Compositions: | | | | | |
| 1 | 100 NMP | 19 | 1.02 | 43 | No PPT |
| 2 | 100 NMP | 19 | 1.02 | 48.5–50 | No PPT |
| 3 | 100 NMP | 19 | 1.02 | 55 | PPT |
| Compositions of this Invention: | | | | | |
| 4 | 55 NMP-45 TMB | 19 | 0.99 | 51 | No PPT |
| 5 | 55 NMP-45 TMB | 19 | 0.99 | 54 | No PPT |
| 6 | 50 NMP-25 TMB-25 XYL | 18 | 0.99 | 55 | No PPT |

While the compositions of this invention are well adapted for use in spin coating applications, they may be used for other purposes, such as in formation of coatings by spray coating or immersion techniques, formation of films by solvent casting procedures, formation of composites by impregnation, and the like.

The foregoing disclosure has been presented for purposes of illustration and not limitation. As can readily be appreciated by those skilled in the art, this invention is susceptible to considerable variation in its practice within the spirit and scope of the ensuing claims.

What is claimed is:

1. A partially fluorinated polyamic acid composition especially adapted for use in spin coating wafers of semiconductive materials which composition comprises a solution of (i) a 2,2-bis(3,4-dicarboxyphenyl)hexafluoropropane dianhydride/2,2-bis hexafluoropropane polyamic acid polymer having an inherent viscosity in the range of about 0.2 to about 1.5 dL/g (as measured in N-methylpyrrolidone at 25° C. at a concentration of 0.5 g/dL) in (ii) a solvent containing at least 40% by weight of one or more liquid aromatic hydrocarbons having a boiling point of at least about 110° C. and at least 5% by weight of one or more dipolar aprotic solvents having a boiling point of at least about 150° C., such that the solution (a) contains on a weight basis from about 5% to about 40% of such polyamic acid and (b) does not undergo precipitate formation during spin coating in an atmosphere of up to at least about 55% relative humidity.

2. A composition of claim 1 wherein the 2,2-bis hexafluoropropane of said polyamic acid is 2,2-bis hexafluoropropane.

3. A composition of claim 2 wherein the solvent additionally contains at least one additional co-solvent that does not cause the solution to undergo precipitate formation during spin coating in an atmosphere of up to at least about 55% relative humidity.

4. A composition of claim 2 wherein the solvent is essentially a mixture of N-methylpyrrolidone and at least one liquid methylbenzene.

5. A composition of claim 1 wherein said solution contains on a weight basis from about 10% to about 25% of such polyamic acid.

6. A composition of claim 1 wherein the inherent viscosity of the polyamic acid as measured at a concentration of 0.5 g/dL in N-methylpyrrolidone at room temperature is in the range of about 0.3 to about 0.9 dL/g.

7. A composition of claim 1 wherein said solution contains on a weight basis from about 10% to about 25% of such polyamic acid, and wherein the inherent viscosity of the polyamic acid as measured at a concentration of 0.5 g/dL in N-methylpyrrolidone at room temperature is in the range of about 0.3 to about 0.9 dL/g.

8. A composition of claim 7 wherein the 2,2-bis hexafluoropropane of said polyamic acid is 2,2-bis hexafluoropropane.

9. A composition of claim 8 wherein the solvent additionally contains at least one co-solvent that does not cause the solution to undergo precipitate formation during spin coating in an atmosphere of up to at least about 55% relative humidity.

10. A composition of claim 8 wherein the solvent includes one or more methylbenzenes.

11. A composition of claim 10 wherein the dipolar aprotic solvent is N-methylpyrrolidone.

12. A composition of claim 11 wherein the solvent includes xylene.

13. A composition of claim 1 wherein the 2,2-bis hexafluoropropane of said polyamic acid is 2,2-bis hexafluoropropane.

14. A composition of claim 1 wherein the 2,2-bis hexafluoropropane of said polyamic acid is a combination of 2,2-bis hexafluoropropane and 2,2-bis hexafluoropropane.

* * * * *

UNITED STATES PATENT AND TRADEMARK OFFICE
CERTIFICATE OF CORRECTION

PATENT NO. : 4,950,734

DATED : August 21, 1990

INVENTOR(S) : Allan A. Eisenbraun, et al

It is certified that error appears in the above-identified patent and that said Letters Patent is hereby corrected as shown below:

Column 5, line 10 reads "dianhydride/2,2-bis hexafluoropropane" and should read -- dianhydride/2,2-bis[4-(aminophenoxy)phenyl]hexafluoropropane --.

Column 5, lines 26-27, read "2,2-bis hexafluoropropane" and should read -- 2,2-bis[4-(aminophenoxy)phenyl]hexafluoropropane --.

Column 5, lines 27-28 read "2,2-bis hexafluoropropane" and should read -- 2,2-bis[4-(4-aminophenoxy)phenyl]hexafluoropropane --.

Column 6, lines 16-17, read "2,2-bis hexafluoropropane" and should read -- 2,2-bis[4-(aminophenoxy)phenyl]hexafluoropropane --.

Column 6, lines 17-18, read "2,2-bis hexafluoropropane" and should read -- 2,2-bis[4-(4-aminophenoxy)phenyl]hexafluoropropane --.

Column 6, lines 30-31, read "2,2-bis hexafluoropropane" and should read -- 2,2-bis[4-(aminophenoxy)phenyl]hexafluoropropane --.

Column 6, lines 31-32, read "2,2-bis hexafluoropropane" and should read -- 2,2-bis[4-(3-aminophenoxy)phenyl]hexafluoropropane --.

Column 6, lines 33-34, read "2,2-bis hexafluoropropane" and should read -- 2,2-bis[4-(aminophenoxy)phenyl]hexafluoropropane --.

Column 6, line 35, reads "2,2-bis hexafluoropropane" and should read -- 2,2-bis[4-(3-aminophenoxy)phenyl]hexafluoropropane --.

UNITED STATES PATENT AND TRADEMARK OFFICE
CERTIFICATE OF CORRECTION

PATENT NO. : 4,950,734

DATED : August 21, 1990

INVENTOR(S) : Allan A. Eisenbraun, et al

It is certified that error appears in the above-identified patent and that said Letters Patent is hereby corrected as shown below:

Column 6, lines 35-36, read "2,2-bis hexafluoropropane" and should read -- 2,2-bis[4-(4-aminophenoxy)phenyl]hexafluoropropane --.

Signed and Sealed this

Tenth Day of December, 1991

Attest:

HARRY F. MANBECK, JR.

*Attesting Officer*  *Commissioner of Patents and Trademarks*